(12) United States Patent
Deboy et al.

(10) Patent No.: US 6,847,091 B2
(45) Date of Patent: Jan. 25, 2005

(54) VERTICAL SEMICONDUCTOR COMPONENT HAVING A REDUCED ELECTRICAL SURFACE FIELD

(75) Inventors: Gerald Deboy, Unterhaching (DE); Heinz Mitlehner, Uttenreuth (DE); Jenö Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/756,539

(22) Filed: Jan. 8, 2001

(65) Prior Publication Data

US 2001/0020732 A1 Sep. 13, 2001

Related U.S. Application Data

(63) Continuation of application No. PCT/DE99/02039, filed on Jul. 2, 1999.

(51) Int. Cl.$^7$ ............................................. H01L 23/58
(52) U.S. Cl. ................................... 257/495; 257/409
(58) Field of Search ............................... 257/109, 471, 257/267, 281, 487, 488, 490, 495, 496, 297, 263, 409, 342, 168, 494, 339

(56) References Cited

U.S. PATENT DOCUMENTS

| | | | |
|---|---|---|---|
| 4,134,123 A | * | 1/1979 | Shannon ...................... 357/15 |
| 4,654,679 A | | 3/1987 | Muraoka |
| 4,821,095 A | | 4/1989 | Temple |
| 5,218,226 A | * | 6/1993 | Slatter et al. ................ 257/546 |
| 5,438,215 A | | 8/1995 | Tihanyi |
| 5,608,244 A | * | 3/1997 | Takahashi .................... 257/267 |
| 6,091,108 A | * | 7/2000 | Harris et al. ................. 257/339 |
| 6,147,381 A | | 11/2000 | Hirler et al. |

FOREIGN PATENT DOCUMENTS

| | | |
|---|---|---|
| DE | 197 07 513 A1 | 9/1998 |
| EP | 0 426 252 A2 | 5/1991 |
| JP | 353068086 A * | 6/1978 |
| JP | 357037879 A * | 3/1982 |
| JP | 63-186475 | 8/1988 |
| JP | 01-093169 | 4/1989 |

OTHER PUBLICATIONS

Praveen M. Shenoy et al.: "The Planar 6H–SiC ACCUFET: A New High–Voltage Power MOSFET Structure", IEEE Electron Device Letters, Vol. 18, No. 12, Dec. 1997, pp. 589–91.

* cited by examiner

Primary Examiner—Wael Fahmy
Assistant Examiner—Dana Farahani
(74) Attorney, Agent, or Firm—Laurence A. Greenberg; Werner H. Stemer; Ralph E. Locher

(57) ABSTRACT

A vertical semiconductor component having a semiconductor body of a first conductivity type is described. In a surface region of the semiconductor body, at least one zone of a second conductivity type, opposite to the first conductivity type, is embedded. Regions of the second conductivity type are provided in the semiconductor body in a plane running substantially parallel to the surface of the surface region. The regions are in this case sufficiently highly doped that they cannot be depleted of charge carriers when a voltage is applied.

7 Claims, 1 Drawing Sheet

VERTICAL SEMICONDUCTOR COMPONENT HAVING A REDUCED ELECTRICAL SURFACE FIELD

CROSS-REFERENCE TO RELATED APPLICATION

This is a continuation of copending International Application PCT/DE99/02039, filed Jul. 2, 1999, which designated the United States.

BACKGROUND OF THE INVENTION

Field of the Invention

The invention relates to a vertical semiconductor component having a semiconductor body of one conductivity type, in whose surface region at least one zone of another conductivity type, opposite to the one conductivity type, is embedded. The semiconductor component further has regions of the other conductivity type which are provided in the semiconductor body in a plane running essentially parallel to a surface of the surface region. Semiconductor components of this type may be, in particular, n-channel or p-channel MOSFETs (MOS field-effect transistors), insulated gate bipolar transistors (IGBTs), junction field-effect transistors (JFETs), GTOs or diodes.

A Schottky diode, in whose semiconductor body of one conductivity type, floating regions of the other conductivity type are embedded in order to increase the reverse voltage, is known from U.S. Pat. No. 4,134,123. In addition MOSFETs composed of silicon carbide and having a high breakdown field strength and a low switch-on resistance are known from IEEE Electron Device Letters, Vol. 18, No. 12, December 1997, pages 589 to 591.

SUMMARY OF THE INVENTION

It is accordingly an object of the invention to provide a vertical semiconductor component having a reduced electrical surface field that overcomes the above-mentioned disadvantages of the prior art devices of this general type, which is distinguished by a considerable reduction in the electrical surface field while at the same time improving the lateral current distribution and the resistance or pass characteristic.

With the foregoing and other objects in view there is provided, in accordance with the invention, a vertical semiconductor component. The semiconductor component contains a semiconductor body of a first conductivity type and having a surface region with a surface, at least one zone of a second conductivity type, opposite the first conductivity type, and embedded in the surface region of the semiconductor body, and regions formed of the second conductivity type are disposed in the semiconductor body in a plane running substantially parallel to the surface of the surface region. The regions are sufficiently highly doped that they cannot be depleted of charge carriers when a voltage is applied in a reverse direction and in a forward direction of a pn junction formed by the semiconductor body and the zone.

In a vertical semiconductor component of the type mentioned initially, the object is achieved according to the invention in that the regions are sufficiently highly doped that they cannot be depleted of charge carriers when a voltage is applied in the reverse direction and in the forward direction of the pn junction formed by the semiconductor body with the zone of the second conductivity type. The regions may in this case be floating, or some or all of them may be at a fixed potential.

The incorporation of the preferably floating regions, which cannot be depleted, having dopants with a conductivity type opposite to that of the semiconductor body, that is to say, for example, the incorporation of p-conductive regions in an n-conductive semiconductor body, results in that an effective reduction in the electrical surface field can be achieved. This is particularly advantageous in a semiconductor body composed of silicon carbide since, with this semiconductor material and owing to its very high volume breakdown field strength (approximately 2 MV/cm in comparison to approximately 250 kV/cm for silicon), the surface field needs to be reduced in the area of thermal oxides (silicon dioxide approximately 8 MV/cm) in order to allow the maximum blocking capability of semiconductor components, for example transistors, produced from such bodies to be utilized even with small oxide thicknesses.

A development of the invention provides that the vertical distance between the zone of the second conductivity type and the regions, which are preferably floating, is chosen in such a manner that the vertical line integral between the lower edge of the zone facing away from the surface of the zone of the second conductivity type, and the upper edge of the regions, which are preferably floating, facing toward the zone across the doping of the semiconductor body remains below the specific breakdown charge (charge carriers·cm$^{-2}$), which is dependent on the material of the semiconductor body. In a semiconductor body composed of silicon, the line integral thus remains less than $2 \cdot 10^{12}$ charge carriers cm$^{-2}$. Other possible semiconductor materials are, for example, germanium, gallium arsenide, and—as has already been mentioned—silicon carbide, in particular.

The line integral is thus formed at right angles to the pn-junction between the zone of the second conductivity type and the semiconductor body, across the doping in this body. The breakdown charge is in this case linked to the breakdown field strength via Maxwell's $3^{rd}$ equation $\overline{\nabla E} = -4\pi\rho$ (E=electrical field strength; $\rho$=charge density).

In another development of the invention, the preferably floating regions are in the form of dots, strips or grids. Therefore the majority charge carrier current, for example in the drift path of a vertical power MOSFET, is influenced as little as possible. In a transistor such as this, these regions may possibly also be connected at a number of points to the transistor well, which is at the source potential. This allows a considerable reduction to be achieved in the electrical surface field in the areas located between the respective wells.

The invention allows a considerable increase in the doping concentration "above" the preferably floating regions, that is to say between them and the surface of the semiconductor body. This increase in doping is dependent on a homogeneous current distribution and a reduction in the switch-on resistance. In a semiconductor body composed of silicon carbide, thermal silicon dioxide can be used without any problems for gate insulation, owing to the reduced surface field.

The semiconductor component according to the invention can be produced, for example, by implantation of the preferably floating regions and subsequent deposition of an epitaxy covering layer, or by etching of a trench, implantation and filling with monocrystalline semiconductor material. With the first-mentioned method, it is possible to set the doping level in the covering layer above the preferably floating regions freely, while in the second-mentioned method, the doping must actually be fixed during the production process for the semiconductor body.

Other features which are considered as characteristic for the invention are set forth in the appended claims.

Although the invention is illustrated and described herein as embodied in a vertical semiconductor component having a reduced electrical surface field, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
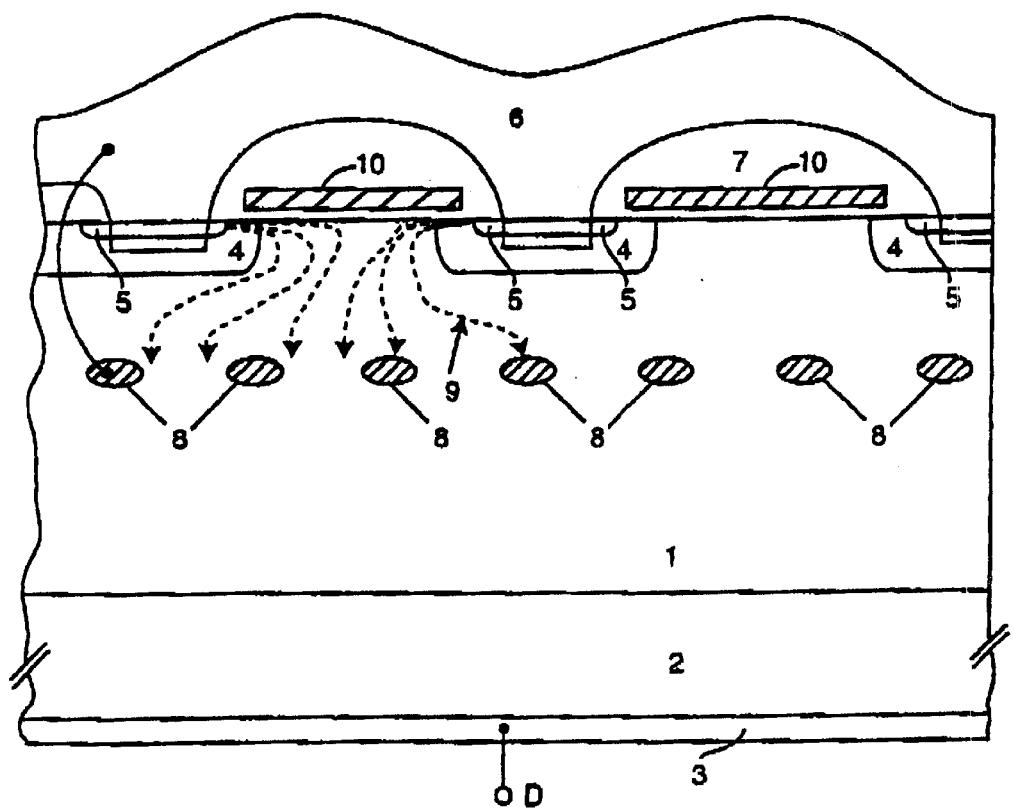
FIG. 1 is a diagrammatic, sectional view of a robust n-channel MOSFET as an exemplary embodiment of a semiconductor component according to the invention.

In all the figures of the drawing, sub-features and integral parts that correspond to one another bear the same reference symbol in each case. Referring now to the figures of the drawing in detail and first, particularly, to FIG. 1 thereof, there is shown an n-channel MOSFET with only specific areas being shaded, for simplicity and to assist clarity. The n-channel MOSFET contains a silicon semiconductor body with an $n^+$-conductive semiconductor substrate 2, an n-conductive semiconductor layer 1 on the substrate 2 as well as a metallization 3 composed, for example, of aluminum. A drain electrode D, a p-conductive well 4, an n-conductive source zone 5, a source metallization 6 composed, for example, of aluminum, an insulating layer 7 composed, for example, of silicon dioxide, and a gate electrode 10 composed, for example, of doped polycrystalline silicon also form the n-channel MOSFET.

According to the invention, p-conductive regions 8 are provided at a vertical distance from the source zone 5 such that a vertical line integral over the doping of the semiconductor layer 1 remains less than approximately $2 \cdot 10^{12}$ charge carriers $cm^{-2}$. N-conductive regions are embedded in an appropriate manner in a p-conductive semiconductor body. The regions 8 are in the form of dots, strips or grids and their dimensions are approximately 1–3 $\mu m$. The regions 8 can also be connected to the well 4 at a number of points. The regions 8 may also, however, all be floating. The doping concentration in the regions 8 is approximately $10^{17}$ charge carriers $cm^{-3}$ and is sufficiently high that these regions are not depleted of charge carriers when a voltage is applied in a reverse direction and in a forward direction of the pn-junction formed between the well 4 and the semiconductor layer 1.

The regions 8 ensure homogeneous distribution of the current, as is indicated by arrows 9, and result in a reduction in the switch-on resistance.

The reduction in the surface field achieved by the region 8 allows a considerable increase in the doping level in the semiconductor layer 2 above the regions 8, which is advantageous especially in the case of silicon carbide. However, the invention can also be used with other semiconductor materials, as has been explained above.

The semiconductor component according to the invention may be, for example, n-channel or p-channel MOS power transistors, IGBTs, JFETs, GTOs or diodes.

Figure 2:
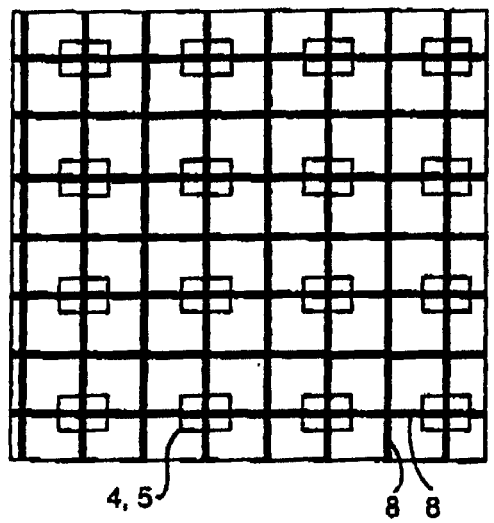
FIGS. 2 and 3 are plan views of two different cell field configurations.
Figure 3:
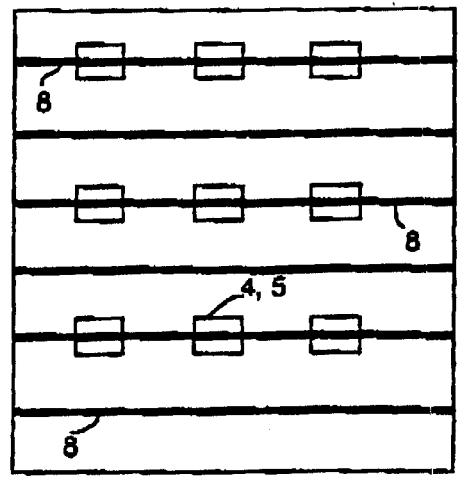

FIGS. 2 and 3 show plan views of cell structures with the regions 8 being configured in the form of grids (FIG. 2) or strips (FIG. 3).

We claim:

1. A vertical semiconductor component, comprising:
    a semiconductor body of a first conductivity type and having a surface region with a surface;
    at least one zone of a second conductivity type, opposite said first conductivity type, embedded in said surface region of said semiconductor body; and
    regions of said second conductivity type disposed in said semiconductor body in a plane running substantially parallel to said surface of said surface region, said regions sufficiently highly doped that they cannot be depleted of charge carriers when a voltage is applied in a reverse direction and in a forward direction of a pn junction formed by said semiconductor body and said zone of said second conductivity type;
    said zone having a lower edge and said regions being floating and having upper edges, a vertical distance between said zone and said regions being chosen such that a vertical line integral between said lower edge of said zone and said upper edges of said regions facing said zone, across a doping of said semiconductor body remains below a specific breakdown charge, which is dependent on a material forming said semiconductor body.

2. The vertical semiconductor component according to claim 1, wherein said semiconductor body is composed of a material selected from the group consisting of silicon carbide, silicon, germanium and gallium arsenide.

3. The vertical semiconductor component according to claim 1, wherein said semiconductor body is composed of silicon, and said vertical line integral remains below $2 \cdot 10^{12}$ charge carriers $cm^{-2}$.

4. The vertical semiconductor component according to claim 1, wherein said regions are dot shaped.

5. The vertical semiconductor component according to claim 1, wherein said regions are strip shaped.

6. The vertical semiconductor component according to claim 1, wherein said regions are disposed in a grid pattern.

7. A vertical semiconductor component, comprising:
    a semiconductor body of a first conductivity type and having a surface region with a surface;
    at least one zone of a second conductivity type, opposite said first conductivity type, embedded in said surface region of said semiconductor body;
    a zone of said first conductivity type embedded in said at least one zone of said second conductivity type; and
    regions of said second conductivity type disposed in said semiconductor body in a plane running substantially parallel to said surface of said surface region, said regions having a doping concentration of approximately $10^{17}$ charger carriers $cm^{-3}$ and being sufficiently highly doped to prevent them being depleted of charge carriers upon a voltage being applied in a reverse direction and in a forward direction of a pn junction formed by said semiconductor body and said zone of said second conductivity type;
    said zone of said second conductivity type having a lower edge and said regions having upper edges, a vertical distance between said zone of said second conductivity and said regions being chosen to cause a vertical line integral between said lower edge of said zone of said second conductivity and said upper edges of said regions facing said zone of said second conductivity, across a doping of said semiconductor body to remain below a specific breakdown charge, being dependent on a material forming said semiconductor body.

* * * * *

UNITED STATES PATENT AND TRADEMARK OFFICE
CERTIFICATE OF CORRECTION

PATENT NO. : 6,847,091 B2
DATED : January 25, 2005
INVENTOR(S) : Gerald Deboy et al.

It is certified that error appears in the above-identified patent and that said Letters Patent is hereby corrected as shown below:

<u>Title page,</u>
Item [30], Foreign Application Priority Data, should read as follows:
-- Jul. 7, 1998        (DE)        ......... 198 30 332 --

Signed and Sealed this

Twenty-second Day of March, 2005

JON W. DUDAS
*Director of the United States Patent and Trademark Office*